US007100254B2

(12) United States Patent
Tanikawa et al.

(10) Patent No.: US 7,100,254 B2
(45) Date of Patent: Sep. 5, 2006

(54) METHOD OF MANUFACTURING AN INK-JET PRINTHEAD

(75) Inventors: Toru Tanikawa, Kanagawa (JP); Hiroshi Tokunaga, Tokyo (JP); Shota Nishi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/994,010

(22) Filed: Jan. 23, 2002

(65) Prior Publication Data

US 2002/0095755 A1 Jul. 25, 2002

Related U.S. Application Data

(60) Division of application No. 09/423,793, filed on Nov. 10, 1999, now Pat. No. 6,431,691, which is a continuation of application No. PCT/JP99/00699, filed on Feb. 18, 1999.

(30) Foreign Application Priority Data

Feb. 18, 1998 (JP) .............................. P10-036156
Feb. 18, 1998 (JP) .............................. P10-036157
Feb. 20, 1998 (JP) .............................. P10-038616

(51) Int. Cl.
*H04R 17/10* (2006.01)
*H05K 3/10* (2006.01)

(52) U.S. Cl. ...................... 29/25.35; 29/890.1; 29/846; 29/593; 310/357

(58) Field of Classification Search ............... 29/25.35, 29/890.1, 846, 593; 347/68, 70, 71, 69; 310/311, 310/357
See application file for complete search history.

(56) References Cited

U.S. PATENT DOCUMENTS 4,994,703 A * 2/1991 Oguri et al. ............... 29/25.35
5,639,508 A * 6/1997 Okawa et al. ............. 29/25.35

FOREIGN PATENT DOCUMENTS

JP 57-60877 * 4/1982 ................ 29/25.35

OTHER PUBLICATIONS

Chen et al., "Development and Electrical Characterization of Lead Zirconate Titanate Thick Films on Silicon Substrates", Proceedings on the 9th IEEE Symposium on Applications of Ferroelectrics, 1994, Aug. 1994, pp. 495-498.*

* cited by examiner

*Primary Examiner*—A. Dexter Tugbang
(74) *Attorney, Agent, or Firm*—Reed Smith, LLP

(57) ABSTRACT

A method of manufacturing a piezoelectric actuator, formed of multiple concave parts which are provided on one surface. First, a first sheet is formed of pliant piezoelectric materials and a second sheet is formed of pliant predetermined materials, forming an upper electrode layer formed of conduction materials on one surface of said first sheet, and forming a lower electrode layer formed of conduction materials on the other surface of said first sheet or one surface of said second sheet, wherein piezoelectric material is used as said material of the second sheet and electrode layer for polarization formed of conduction material is formed on the other surface side of said second sheet. Next, the first and second sheets are piled and densified. The first sheet is polarized in a direction of a thickness of the first sheet. In a fourth step, the upper electrode layer is patterned in order to form multiple electrodes corresponding respectively to each pressure chamber of the pressure chamber forming unit, wherein by placing a voltage between the upper electrode layer and the electrode layer for polarization, the first sheet is polarized in the direction of its thickness.

6 Claims, 10 Drawing Sheets

METHOD OF MANUFACTURING AN INK-JET PRINTHEAD

The application is a Divisional of application Ser. No. 09/423,793, filed on Nov. 10, 1999, now U.S. Pat. No. 6,431,691, which is a continuation of International Application PCT/JP99/00699.

TECHNICAL FIELD

The present invention relates to a piezoelectric actuator and its manufacturing method and an ink-jet printhead, and is suitably applied to such as an ink-jet printer device.

BACKGROUND ART

Heretofore, in the ink-jet printer device, ink is jetted from a nozzle corresponding to a recording signal and characters and graphics based on said recording signal can be recorded on the recording medium such as paper and film.

FIG. 11 shows an example of the construction of a conventional ink-jet printhead 1 that has been used in the ink-jet printhead device. This ink-jet printhead comprises a passage plate 2 of which one surface 2A is affixed to a nozzle plate 3 and the other surface 2B is affixed to a piezoelectric actuator 4.

In this case, pressure chambers 2C comprised of multiple concave parts are arranged on one surface side 2A of the passage plate 2 along the direction shown an arrow $x_1$ at established intervals. And ink can be continuously supplied from the ink cartridge (not shown in FIG.) into these pressure chambers 2C through a common passage 2D respectively.

Moreover, at the edge of each pressure chamber 2C, a through path 2E is formed cutting through the passage plate 2 in the direction of its thickness (in the direction of an arrow $z_1$), and nozzles 3A formed of multiple through holes are formed cutting through the nozzle plate 3 corresponding respectively to each through path 2E along the direction of an arrow $x_1$ at established intervals.

On the other hand, as shown in FIGS. 11 and 12, a piezoelectric actuator 4 is comprised of multiple piezoelectric elements 6 arranged on one surface of the vibration plate 5 formed of flexible materials along the direction of an arrow $x_1$ facing respectively to pressure chamber 2C of the passage plate 2 via said vibration plate 5, and it is fixed to said passage plate 2 affixing the other surface of the vibration plate 5 onto the other surface 2B of the passage plate 2.

At this point, each piezoelectric element 6 is polarized in the direction of its thickness (in the direction of an arrow $z_1$). And as shown in FIG. 9, upper electrode 7A and lower electrode 7B are formed on one surface and the other surface of the piezoelectric element 6 respectively. And thus, by causing voltage difference between the upper electrode 7A and the lower electrode 7B, the piezoelectric element 6 can be deflected in the direction to displace the vibration plate 5 toward inside of the corresponding pressure chamber 2C according to the piezoelectric effects (the direction opposite to the arrow $z_1$).

Thus, in this type of ink-jet printhead 1, by generating the voltage difference between the upper electrode 7A and the lower electrode 7B of the piezoelectric element 6 and displacing the vibration plate 5 toward inside of the corresponding pressure chamber 2C, the pressure corresponding to that deviation can be generated in the pressure chamber

2C and ink in said pressure chamber 2C can be jetted outside from the nozzle 3A under this pressure via the through path 2E.

In the ink-jet printhead 1, as disclosed in Japan Patent Laid-open No. H6-320739 bulletin, for example, the piezoelectric actuator 4 was manufactured by bonding each piezoelectric element 6 onto the vibration plate 5 using adhesives after the vibration plate 5 and piezoelectric element 6 were formed independently.

However, according to the conventional manufacturing method, it was difficult to paste multiple fine piezoelectric elements 6 precisely onto the fixed positions of the vibration plate 5. In this connection, if the position on which the piezoelectric element 6 is to be pasted is displaced from the fixed position, the pressure based on deflection of piezoelectric element 6 cannot be generated in the corresponding pressure chamber 2C and accordingly the printing becomes unstable.

Furthermore, generally the larger the size of electric field to be printed becomes, the more the piezoelectric element warps. Therefore, in order that the conventional ink-jet printhead 1 can be driven with low voltage, each piezoelectric element 6 should be formed as thin as possible making the distance between upper electrode 7A and the lower electrode 7B short and at the same time, the vibration plate 5 is formed as thin as possible and in practice, the conventional vibration plate 5 and each piezoelectric element 6 have the thickness of less than 30 (μm) respectively.

However, in order to shorten the natural vibration cycle and increase the corresponding speed, the vibration plate 5 is made up of such as glass and ceramic materials having high Young's modulus as its material. But it is difficult to make a thin sheet having less than 30 (μm) using glass or ceramic materials. And heretofore, the vibration plate 5 has been made by grinding the glass plate or ceramic plate having the thickness of several hundreds (μm) till it becomes thinner than 30 (μm).

Accordingly, in the conventional ink-jet printhead 1, it caused problems due to the costly and time consuming manufacturing process of the vibration plate S and poor productivity. Moreover, the piezoelectric element 6 having thinner than 30 (μm) was obtained by grinding it in the same manner as the vibration plate 5 and the realization of a piezoelectric actuator 4 having higher productivity has been desired.

Moreover, in the conventional ink-jet printhead 1, since the vibration plate S and each piezoelectric element 6 are formed extremely thin, these vibration plate 5 and piezoelectric element 6 are easily damaged. And in addition to the poor productivity as described above, it has caused the problem in handling at the time when manufacturing the vibration plate 5 and each piezoelectric element 6.

DISCLOSURE OF INVENTION

The present invention has been done considering the above points and is proposing a piezoelectric actuator and its manufacturing method and an ink-jet printhead capable of improving the productivity remarkably.

To obviate such problems according to the present invention, we provide a vibration layer to be arranged on one surface of the pressure chamber forming unit to cover each pressure chamber, a lower electrode layer formed of conduction materials laminated on the vibration layer, a piezoelectric layer formed of piezoelectric materials laminated on the lower electrode layer and having the size to cover multiple pressure chambers and polarized in the direction of its thickness, and an upper electrode layer formed of conduction materials laminated on the piezoelectric layer in the piezoelectric actuator, and at least either the upper electrode layer or the lower electrode layer is formed of multiple electrodes separated and formed corresponding to each pressure chamber of the pressure chamber forming unit.

As a result, since in this piezoelectric actuator, of piezoelectric layers only the part directly below each electrode of the upper electrode layer and/or the part directly above each electrode of the upper electrode layer will warp corresponding to the placement of voltage, these parts of upper electrode layer and pressure layer and the corresponding parts of the lower electrode layer and vibration layer function as an independent actuator respectively.

Accordingly, in this piezoelectric actuator it is not necessary to form the actuator by affixing fine piezoelectric materials onto the vibration layer corresponding to each pressure chamber of the pressure chamber forming unit and thus, its productivity can be remarkably improved.

Moreover, according to the present invention, we provide in the piezoelectric actuator manufacturing method, the first process for forming a pliant first sheet made up of piezoelectric materials and a pliant second sheet made up of predetermined material and as well as forming the upper electrode layer formed of conduction materials on one surface of the first sheet, forming the lower electrode layer made up of conduction materials on the other surface of the first sheet or on one surface of the second sheet, the second process for piling up and densifying the first and the second sheets having the lower electrode layer between, the third process for polarizing the first sheet in the direction of its thickness, and the fourth process for patterning the upper electrode layer to form multiple electrodes corresponding respectively to each pressure chamber of the pressure chamber forming unit.

As a result, in the piezoelectric actuator manufactured according to this piezoelectric actuator manufacturing method, since of the first piezoelectric layer formed of the first sheet, since only the part directly below each electrode of the upper electrode layer and/or the part directly above each electrode of the upper electrode layer warp responding to the voltage placement, these parts of the upper electrode layer and the pressure layer and the corresponding parts of the lower electrode layer and the vibration layer formed of the second sheet function respectively as an independent actuator.

Thus, according to this piezoelectric actuator manufacturing method it is not necessary to form an actuator by pasting the fine piezoelectric element onto the vibration layer corresponding respectively to each pressure chamber of the pressure chamber forming unit, and thereby the productivity of the piezoelectric actuator can be outstandingly improved.

Furthermore, according to the present invention, in the piezoelectric actuator manufacturing method, the first process for forming multi-layer plate in which the upper electrode layer is laminated on one surface of the piezoelectric layer and the vibration layer is laminated on the other surface of the piezoelectric layer having the lower electrode layer between, and the second process for laminating and forming a reinforcement layer having openings with the prescribed size and shape on one surface side or the other surface side of the multi-layer together with the multi-layer plate are provided.

As a result, according to this piezoelectric actuator manufacturing method, since the multi-layer plate can be handled under the condition in which the multi-layer plate is reinforced by the reinforcement layer, breakage of said multi-layer plate can be prevented even when the multi-layer plate is very thin and the yield can be increased and thereby the productivity of the piezoelectric actuator can be remarkably improved.

Furthermore, according to the present invention, in the inkjet printhead, the piezoelectric actuator is comprised of vibration layer to be placed to cover each pressure chamber on one surface of the pressure chamber forming unit, the lower electrode layer formed of conduction materials laminated on the vibration layer, the piezoelectric layer formed of piezoelectric materials having the size to cover multiple pressure chambers and laminated on the lower electrode layer and polarized in the direction of its thickness, and the upper electrode layer formed of conduction materials, laminated on the piezoelectric layer. And at least either the upper electrode layer or the lower electrode layer is formed with multiple electrodes separated corresponding respectively to each pressure chamber of the pressure chamber forming unit.

As a result, in this ink-jet printhead, of piezoelectric layer of the piezoelectric actuator, since only the part directly under each electrode of the upper electrode layer and/or the part directly above each electrode of the lower electrode layer warp responding to the voltage placement, these parts of the upper electrode layer and pressure layer and corresponding parts of the lower electrode layer and the vibration layer function respectively as an independent actuator.

Accordingly, in this ink-jet printhead, it is not necessary to form the piezoelectric actuator by affixing fine piezoelectric elements onto the vibration layer corresponding respectively to each pressure chamber of the pressure chamber forming unit, and thereby the productivity of the ink-jet printhead can be remarkably improved.

BEST MODE FOR CARRYING OUT THE INVENTION

Figure 1:
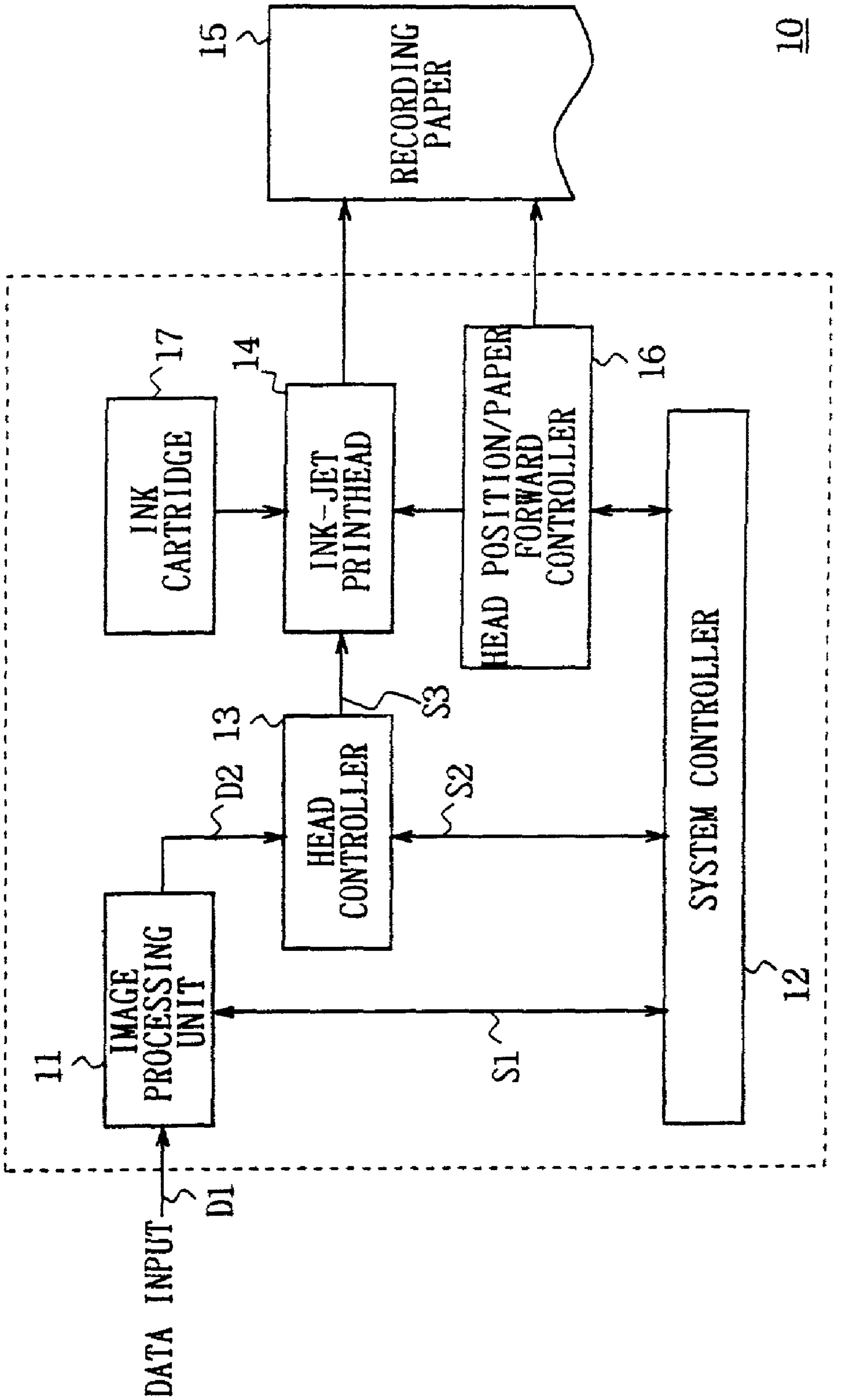
FIG. 1 is a block diagram showing the construction of an ink-jet printer device according to the present invention.

The present invention will be described in detail with reference to the accompanying drawings.

REFERENCE NUMERALS

10 . . . ink-jet printe device
14 . . . ink-jet printhead
20 . . . passage plate
20C . . . pressure chamber
21 . . . nozzle plate
21A . . . nozzle
22 . . . piezoelectric actuator
30, 32 . . . piezoelectric layer
31 . . . lower electrode layer
33 . . . electrode layer for polarization
34 . . . upper electrode layer
34A . . . upper electrode
40, 41, 50 . . . sheet
42 to 44 . . . conductor layer
45, 51 . . . multi-layer plate
51A . . . opening
Adv . . . available part (1) The First Embodiment (1-1) Construction of Ink-Jet Printer Device According to the Embodiment of the Present Invention In FIG. 1, 10 generally shows an ink-jet printer device according to the present invention. And an image data D1 to be supplied is entered into an image processing unit 11.

The image processing unit 11, after applying the prescribed signal processing (such as the expansion processing of the data compressed) to the input image data D1 based on the control signal to be supplied from the system controller 12, transmits the resultant print data D2 to a head controller 13.

The head controller 13 forms a driving signal S3 containing the saw blade shaped driving pulse based on the print data D2 to be supplied from the image processing unit 11 and the control signal S2 to be supplied from the system controller 12 and transmits this to the ink-jet printhead 14. With this arrangement, the head controller 13 drive controls the ink-jet printhead 14 by this driving signal S3 and causes to print line by line by jetting ink toward the recording paper 15.

At this point, the system controller 12, by controlling the paper forward mechanism not shown in Fig. through the head position/paper forward controller 16, causes the recording paper 15 to be forwarded one line every time when the printing for one line is complete. Also, the system controller 12, controlling the head driving mechanism that is not shown in Fig. via the head position/paper forward controller 16, moves the ink-jet printhead 14 to the position required as occasion demands.

In this connection, ink is supplied from the ink cartridge 17 to this ink-jet printhead 14.

(1-2) Construction of Ink-Jet Printhead 14

Figure 2:
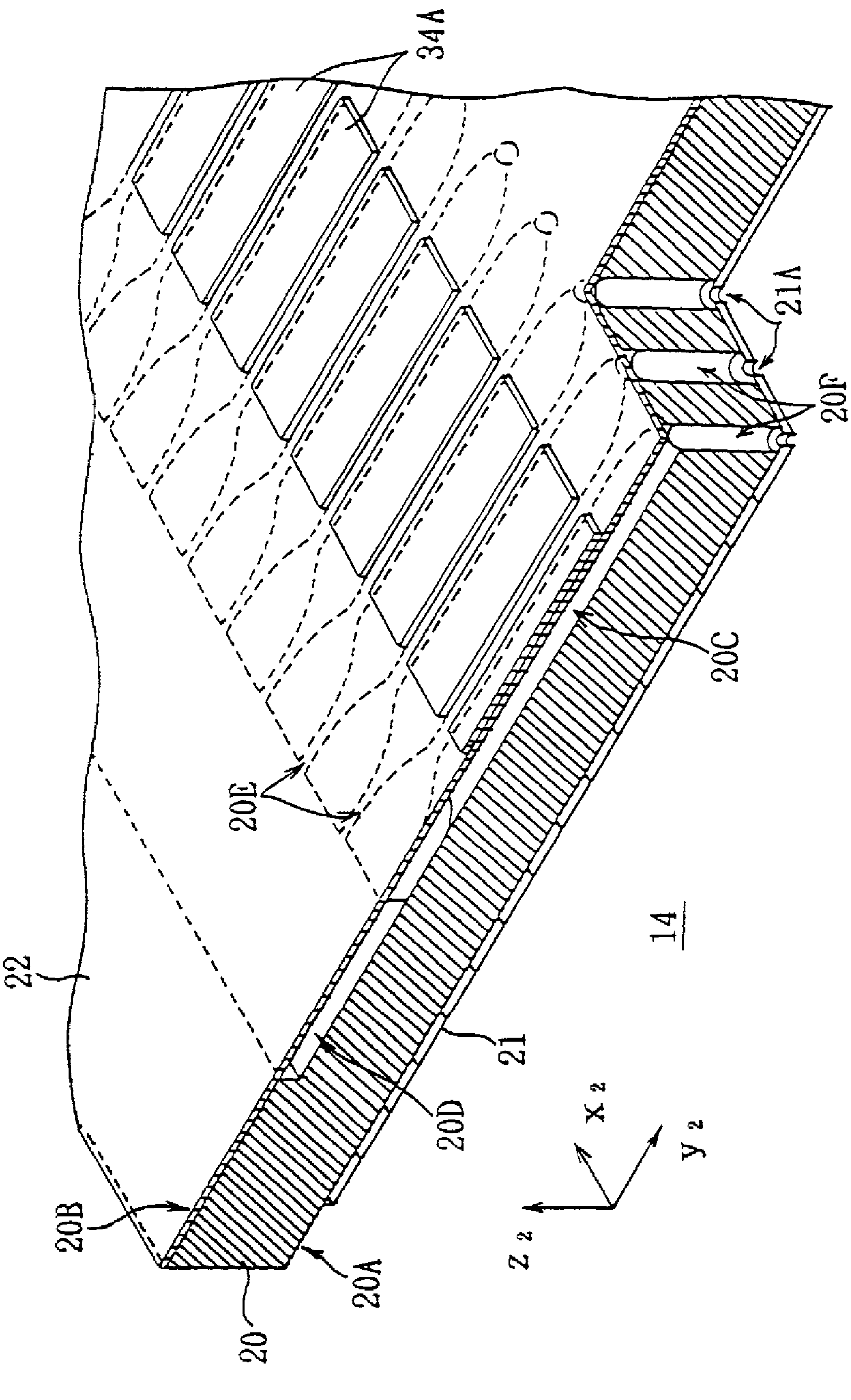
FIG. 2 is a fragmentary perspective view showing the construction of an ink-jet printhead.
Figure 3:
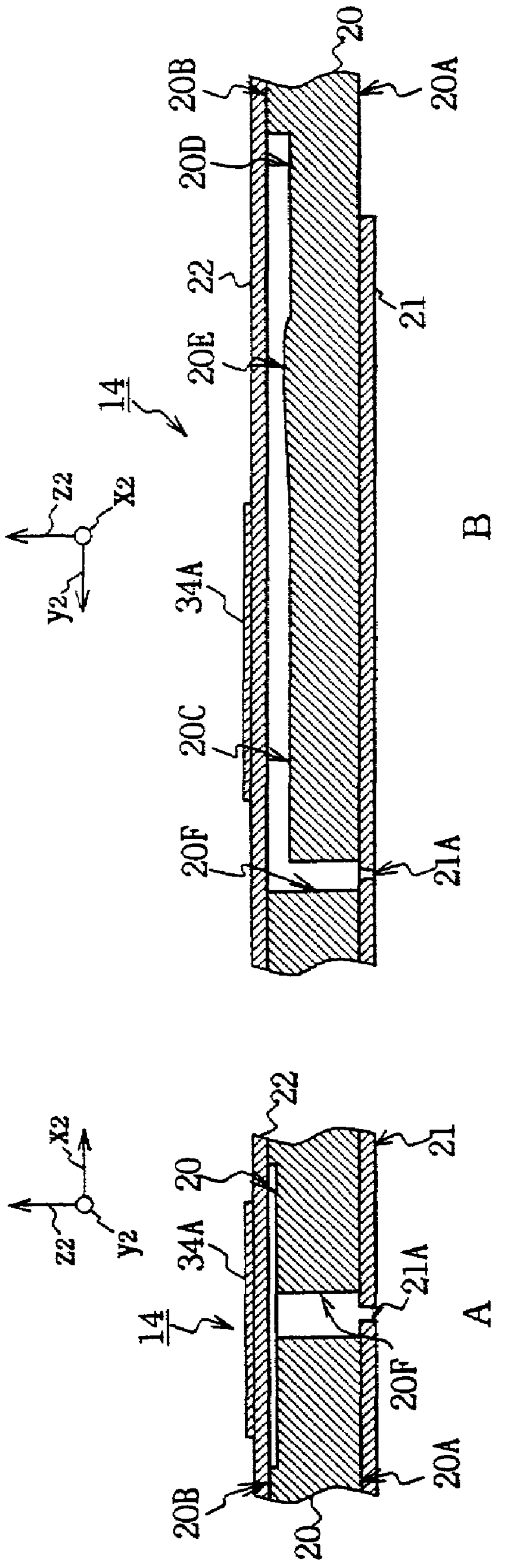
FIG. 3 is a cross-sectional view showing the construction of an ink-jet printhead.

At this point, as shown in FIGS. 2 and 3, the ink-jet printhead 14 comprises a nozzle plate 21 affixed to one surface 20A side of the passage plate 20 and a piezoelectric actuator 22 affixed onto the other surface 20B side of said passage plate 20.

In this case, pressure chambers 20C composed of multiple concave parts are arranged on the other surface 20B side of the passage plate 20 in the direction of an arrow $x_2$ at established intervals. And ink can be supplied from said ink cartridge 17 (FIG. 1) into pressure chambers 20C respectively through the common passage 20D and narrow ink input path 20E provided in the rear of each pressure chamber 20C.

Moreover, at the front edge of each pressure chamber 20C, through passages 20F are cut by cutting through the passage plate 20 in the direction of its thickness (the direction of an arrow $z_2$) and nozzles 21A formed by multiple through holes are formed by cutting through the nozzle plate 21 corresponding respectively to the through passages 20F in the direction of an arrow $x_2$ at the fixed pitches.

Figure 4:
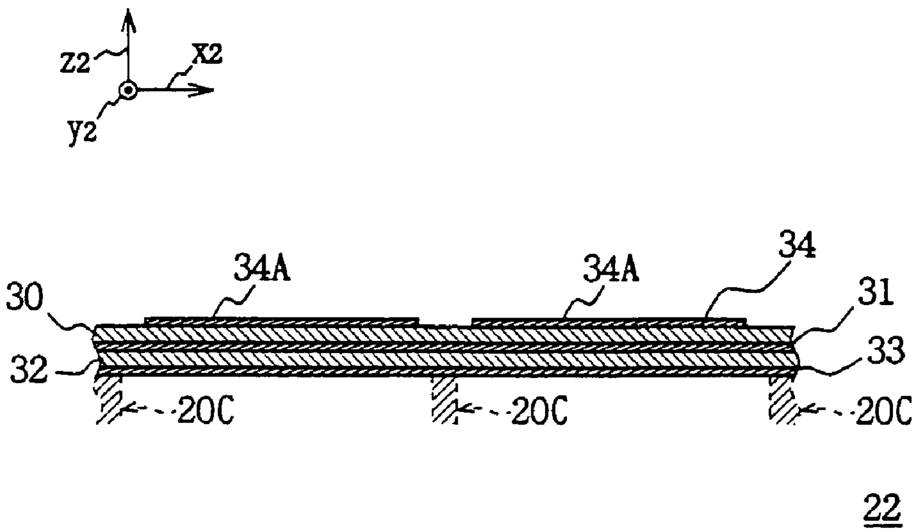
FIG. 4 is a cross sectional view showing the construction of a piezoelectric actuator.

On the other hand, as shown in FIG. 4, the piezoelectric actuator 22 is constituted by the first piezoelectric layer 30 formed of piezoelectric material, the lower electrode layer 31 formed of conduction material, the second piezoelectric layer 32 formed of piezoelectric material, and the electrode layer for polarization 33 formed of conduction material, which are laminated successively in this order from the top and the upper electrode layer 34 formed of multiple upper electrodes 34A separated and formed in the direction of an arrow $x_2$ facing to each pressure chamber 20C of the passage plate 20 laminated on the first piezoelectric layer 30.

In this case, the first piezoelectric layer 30 is polarized in the direction of its thickness (the direction of an arrow $z_2$). Also the lower electrode layer 31 is grounded and the driving pulse contained in the driving signal S3 (FIG. 1) to be supplied from the head controller 13 (FIG. 1) will be supplied respectively into each upper electrode 34A.

Thus, in this ink-jet printhead 14, when the driving pulse is given to the corresponding upper electrode 34A, the part between said upper electrode 34A and the lower electrode 31 in the first piezoelectric layer 30 warps in the direction to displace the electrode layer for polarization 33 and the second piezoelectric layer 32 toward inside of the corresponding pressure chamber 20C of the passage plate 20 (in the opposite direction to the arrow mark $z_2$) by the piezoelectric effects and pressure will be generated in the pressure chamber 20C, and thus, ink in the pressure chamber 20C can be jetted from the corresponding nozzle 21A (FIGS. 2 and 3) to outside via the through path 20F (FIGS. 2 and 3)

(1-3) Manufacturing Procedure of Piezoelectric Actuator 22 according to the Embodiment of the Present Invention In practice, the piezoelectric actuator 22 of the ink-jet printhead 14 can be produced according to the procedure shown in FIGS. 5 and 6 as follows.

Firstly, powdered piezoelectric materials and binder are mixed and the resultant pasty liquid will be flown out in the thin film shape and by vaporizing and drying the binder, two pliant sheets, the first and the second sheets 40 and 41 called green sheets having the thickness of less than 30 (μm) will be formed as shown in FIG. 5A.

Then, as shown in FIG. 5B, by applying the conduction material coating to the entire surface of one surface of the-first sheet 40 and both surfaces of the second sheet 41 using the printing method, the plating method, the sputtering method or the vacuum evaporation method respectively, the first~the third conductor layers 42~44 will be formed with the thickness such as less than 2 (μm).

At this point, if the printing method is used as the forming method of the first~third conductor layers 42~44, silver, silver palladium, nickel or copper can be applied as the conduction material. Moreover, in the case of using the sputtering method or the vacuum evaporation method, gold can be used as the conduction material.

Then, as shown in FIG. 5C, the first sheet 40 on which the first conductor layer 42 is formed and the second sheet 41 on and under which the second~the third conductor layers 43~44 are formed are piled so that the other surface of the first sheet 40 and one surface of the second sheet 41 face each other via the second conductor layer 43, and under such conditions by pressing and densifying these, these will be densified into a piece.

Then next, as shown in FIG. 5D, by applying voltage of several (kV) per 1 (mm) thickness between the first and the third conductor layers 42 and 44 of the multi-layer plate 45 in which the third conductor layer 44, the densified second sheet 41, the second conductor layer 43, the densified first sheet 40 and the first conductor layer 42 are successively laminated, the first sheet 40 will be polarized in the direction of its thickness (in the direction of an arrow $z_2$).

In this case, as the method to polarize the first sheet 40, the method of placing the voltage between the first and the second conductor layers 42 and 43 is considered. However, according to this method there is the possibility of an occurrence of deflection in the multi-layer plate when the first sheet 40 is shrunk due to polarization. Thus, according to this embodiment, as well as providing the third conductor layer 44 under the second sheet 41, forming the second sheet 41 by the piezoelectric material, and by placing the voltage between the first and the third conductor layers 42 and 44 and polarizing both the first and the second sheets 40 and 41, the occurrence of unnecessary warp in the multi-layer plate 36 can be prevented.

Next, as shown in FIG. 6A, by attaching a photosensitive dry film or coating the liquid photoresist on the first conductor layer 42 of the multi-layer plate 45, a resist layer 46 is formed. And then, by exposing and developing this resist layer 46 by the prescribed pattern, as shown in FIG. 6B, said resist layer 46 will be patterned to the same electrode pattern as the piezoelectric actuator 22 (FIGS. 2 and 3).

Then, as shown in FIG. 6C, making the resist layer 46 remaining on the first conductor layer 42 (hereinafter referred to as residual resist layer 46A) as a mask, by eliminating the exposing first conductor layer 42 using the sandblast method or etching method, the first conductor layer 42 will be patterned to the same electrode pattern as the desired piezoelectric actuator 22 (FIGS. 2 and 3).

Moreover, as shown in FIG. 6D, the residual resist layer 46A is eliminated from the multi-layer plate 45 and furthermore, this multi-layer plate 45 will be cut in the size corresponding to the desired piezoelectric actuator 22 as occasion demands.

Thus, the piezoelectric actuator 22 that makes the densified first and second sheets 40 and 41 to be the first and second piezoelectric layers 30 and 32 respectively and the first~the third conductor layers 42~44 to be the upper electrode layer 34, the lower electrode layer 31 and the electrode for polarization 33 respectively can be obtained.

And thus formed piezoelectric actuator 22 is bonded on the other surface 20C of the passage plate 20 so that each upper electrode 34A faces to each pressure chamber 20C of the passage plate 20, and by bonding the nozzle plate 21 on which nozzles 21A are formed on one surface 20A of the passage plate 20 using such as adhesives, the ink-jet printhead 14 shown in FIGS. 2 and 3 can be obtained.

(1-4) Operation and Effects of the Present Embodiment

According to the foregoing construction, after the first~the third conductor layers 42~44 are formed on one surface or both surfaces of the first~the second sheets 40 and 41 formed of piezoelectric materials, these first and the second sheets 40 and 41 are densified in a piece, and the resultant first sheet 40 of the multi-layer plate 45 is polarized and the piezoelectric actuator 22 will be made by patterning the first conductor layer 42 with the sandblast method or the etching method.

Figure 11:
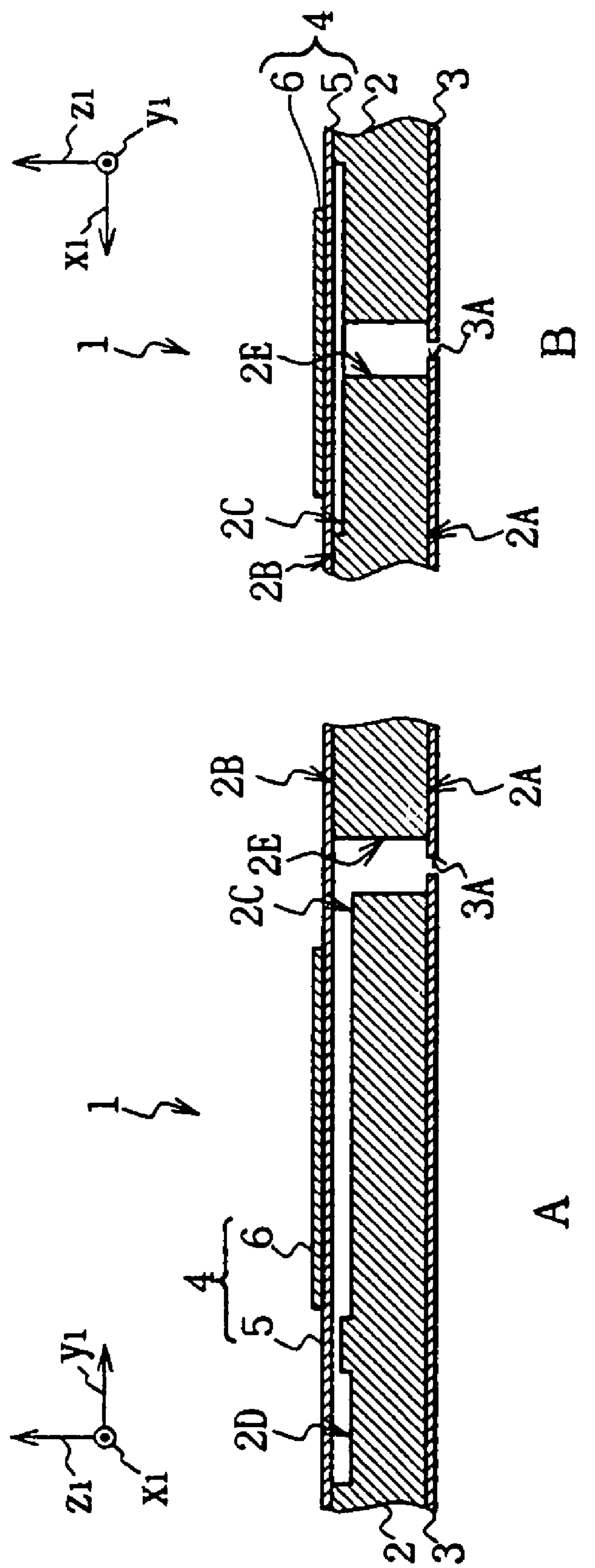
FIG. 11 (Prior Art)
FIG. 11 is a cross sectional view showing the construction of a conventional ink-jet printhead.

And in thus manufactured piezoelectric actuator 22, the first conductor layer 42 patterned functions as the upper electrode, the first sheet 40 functions as the piezoelectric layer, the second conductor layer 43 functions as the lower electrode, the second sheet 41 and the third conductor layer 44 function as the vibration plate respectively, and in said piezoelectric layer, only parts sandwitched between each upper electrode (each upper electrode 34A) and the lower electrode (the lower electrode layer 31) function as the piezoelectric element 6 (FIG. 11) in the conventional ink-jet printhead 1 (FIG. 11) respectively.

Accordingly, in this ink-jet printhead 14, the processing to determine the positions of multiple fine piezoelectric elements 6 on the vibration plate 5 and affix these at the high accuracy and the polishing processing required in the conventional ink-jet printhead 1 (FIG. 11) become unnecessary and the piezoelectric actuator 22 can be manufactured simply and economically.

Furthermore, in this case, since the thickness of the multilayer plate 45 can be made as thick as the piezoelectric element 6 and the vibration plate 5 (FIG. 11) combined in the conventional ink-jet printhead 1 (FIG. 11), said multi-layer plate 45 is not easily damaged and can be handled easily.

According to the foregoing construction, since after the first~the third conductor layers 42~44 are formed on one surface or both surfaces of the first and the second sheets 40 and 41, these first and the second sheets 40 and 41 are densified in one piece and the resultant first sheet 40 of the multi-layer plate 45 is polarized and simultaneously, by conducting the patterning onto the first conductor layer 42 using the sandblast method or the etching method, the piezoelectric actuator 22 is made and ink-jet printhead 14 is manufactured by attaching this to the other surface 20C of the passage plate 20, the manufacturing process of the piezoelectric actuator 22 and ink-jet printhead 14 can be simplified and the piezoelectric actuator and the ink-jet printhead capable of remarkably improving the productivity can be realized.

Figure 5:
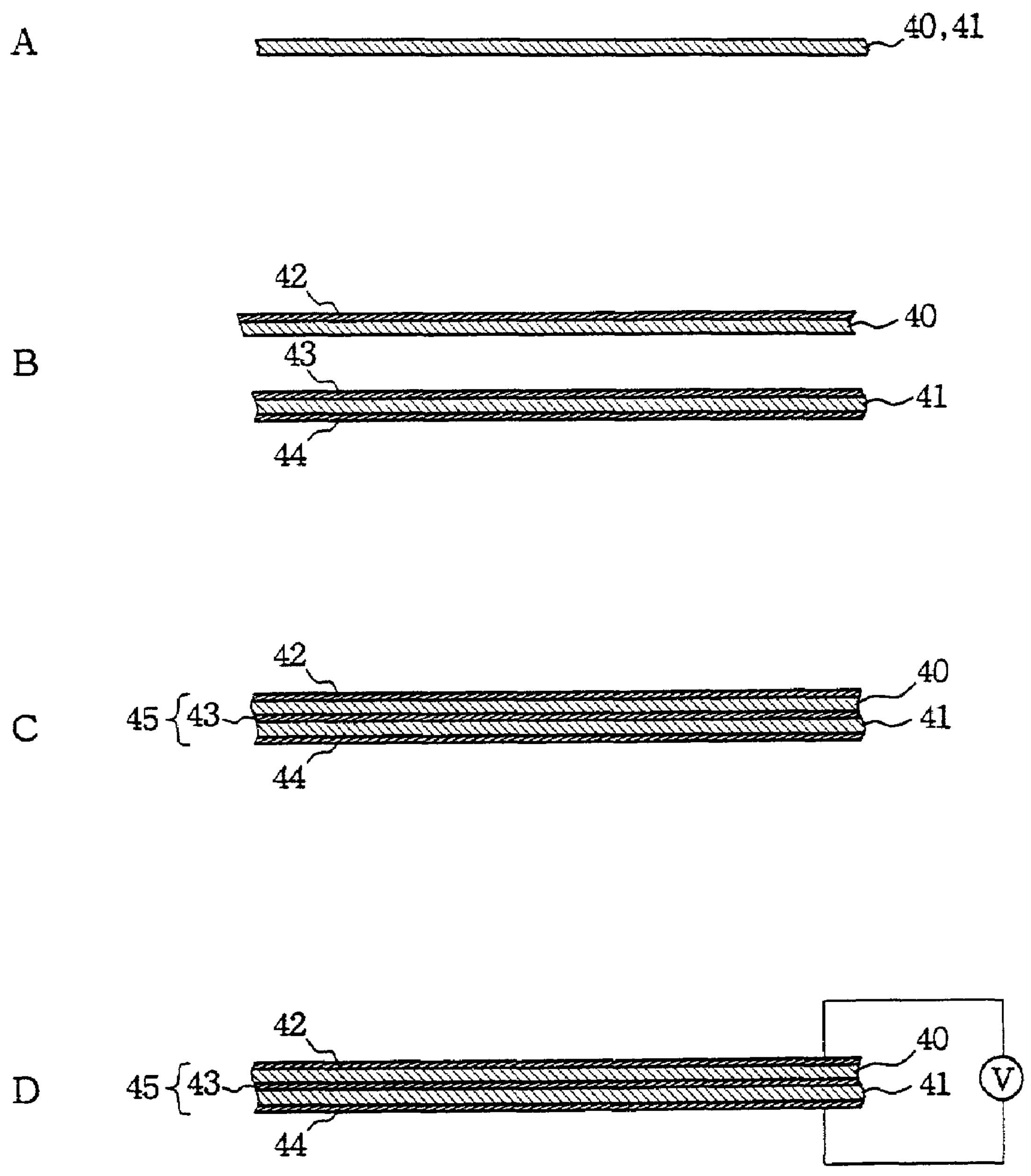
FIG. 5 is cross sectional views illustrating the manufacturing procedures of a piezoelectric actuator according to the first embodiment.
Figure 6:
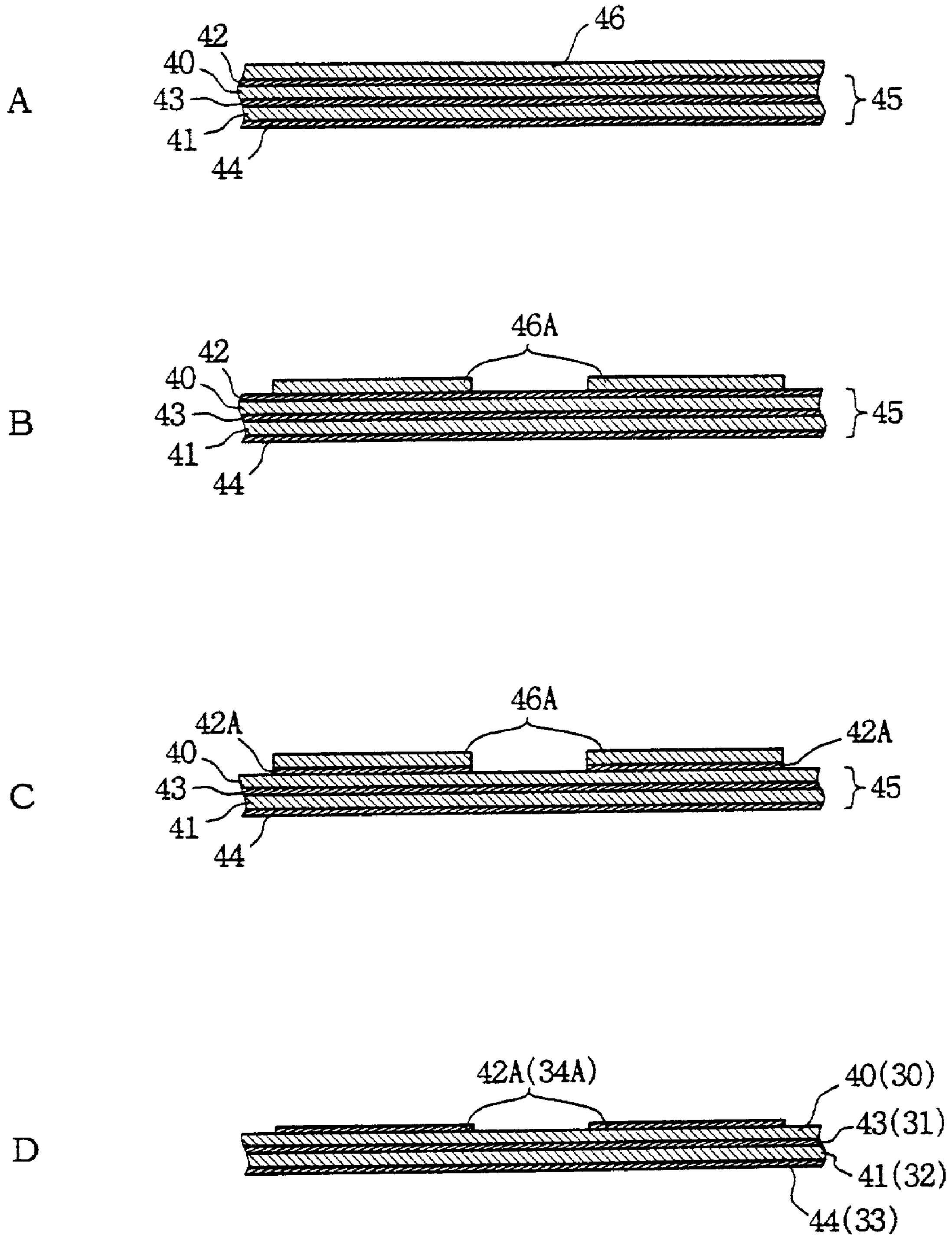
FIG. 6 is cross sectional views illustrating the manufacturing procedures of a piezoelectric actuator according to the first embodiment.
Figure 7:
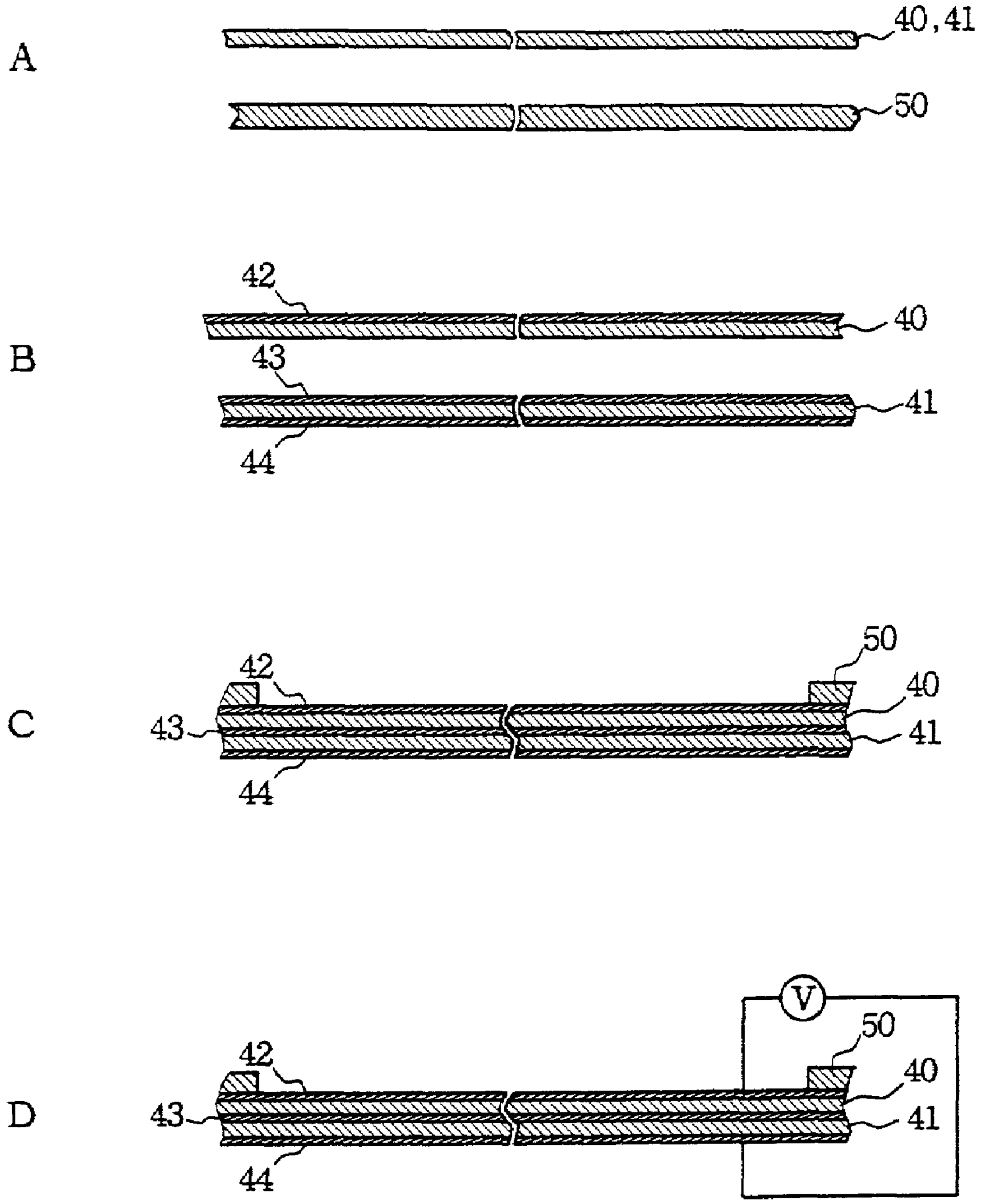
FIG. 7 is cross sectional views illustrating the manufacturing procedures of a piezoelectric actuator according to the second embodiment.
Figure 8:
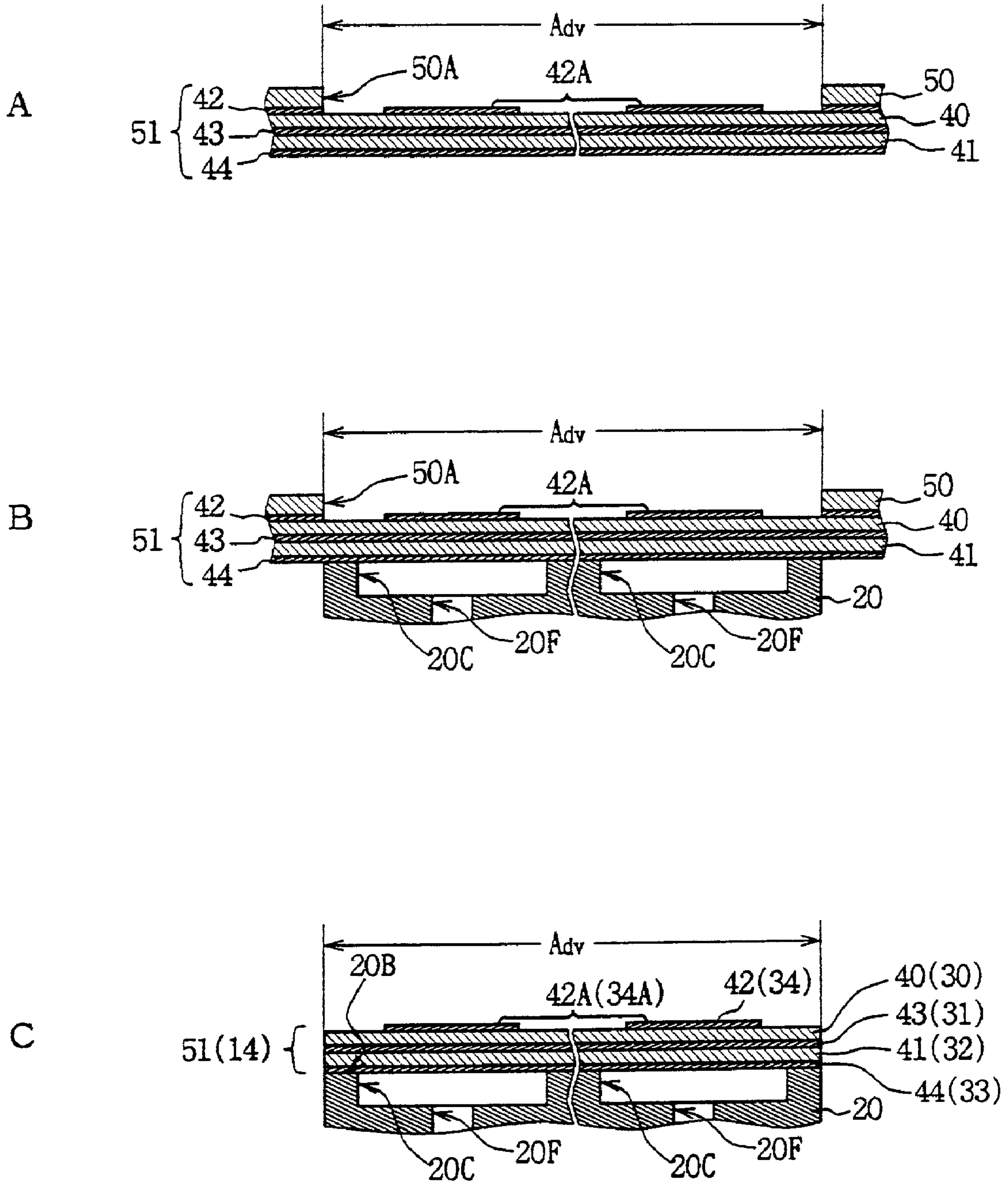
FIG. 8 is cross sectional views illustrating the manufacturing procedures of a piezoelectric actuator according to the second embodiment.

(2) The Second Embodiment (2-1) Manufacturing Procedure of Piezoelectric Actuator 22 According to the Second Embodiment The manufacturing procedure according to the second embodiment of the piezoelectric actuator 22 described above in FIG. 4 will be explained with reference to FIGS. 7 and 8, where parts corresponding to those in FIGS. 5 and 6 are designated the same reference numerals, in the following chapters.

First, as shown in FIG. 7A, the flexible first and second sheets 40 and 41 called green sheet having the thickness of less than 30 (μm) will be formed in the same manner as in the case of the first embodiment.

Moreover, the third sheet 50 formed of green sheet will be formed by using such as ceramic materials. In this case, in order that this third sheet 50 functions as the reinforcement layer in the manufacturing process of the piezoelectric actuator 22, the third sheet 50 is formed thicker than the first and the second sheets 40 and 41.

Then, as shown in FIG. 7B, by coating conduction materials onto one surface of the first sheet 40 and both surfaces of the second sheet 41 using the printing method, plating method, sputtering method or vaporization method, the first~the third conductor layers 42~44 will be formed with the thickness of less than 2 (μm) for example.

Figure 9:
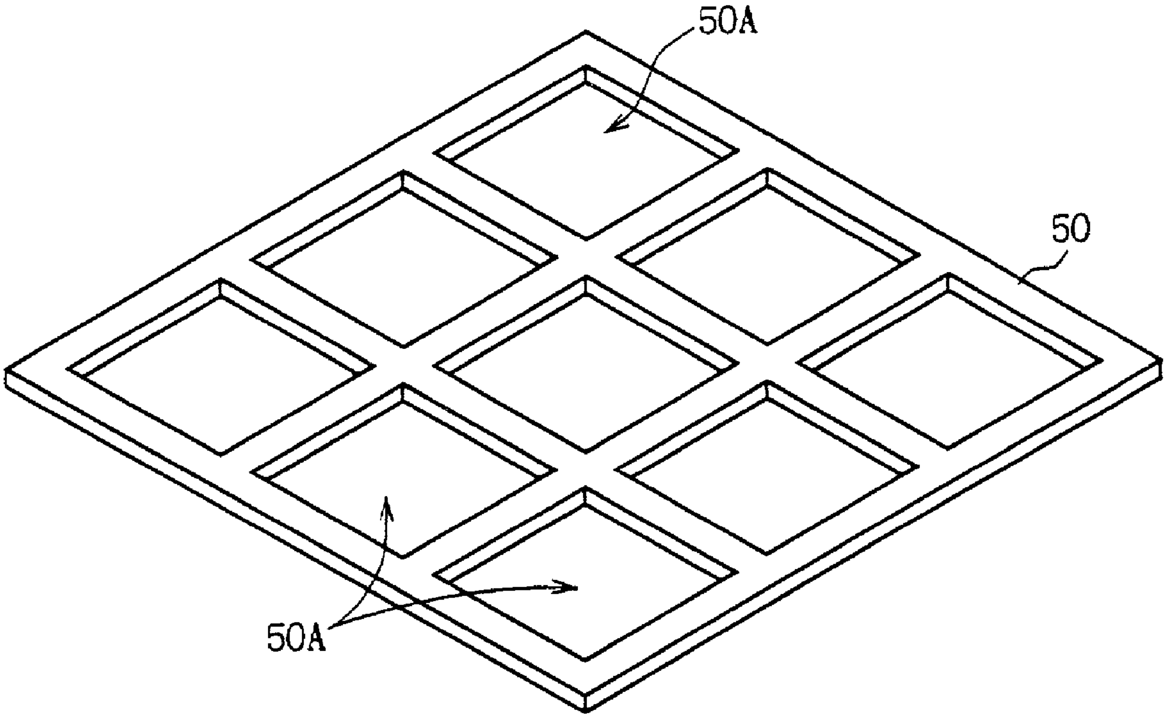
FIG. 9 is a perspective view showing the construction of the third sheet.

Furthermore, as shown in FIG. 9, one or more openings 50A having the same size and shape as the piezoelectric actuator 22 to be manufactured will be formed on the third sheet 50 corresponding to the size of said third sheet 50.

Then, as shown in FIG. 7C, the first~the third sheets 40, 41 and 50 are piled so that the conductor layer 44, the second sheet 41, the second conductor layer 43, the first sheet 40, the first conductor layer 42 and the third sheet 50 are positioned in this order from the bottom, and under this condition the first the third sheets 40, 41 and 50 are pressed and densified into one piece.

Next, as shown in FIG. 7D, applying the voltage of several (kV) per 1 (mm) thickness between the first and the third conductor layers 42 and 44 of the multi-layer plate 51 on which the third conductor layer 44, the densified second sheet 41, the second conductor layer 43, the densified first sheet 40, and the first conductor layer 42 are sequentially laminated, the first sheet 40 will be polarized in the direction of its thickness.

Moreover, as shown in FIG. 8A, each part of the first conductor layer 42 exposed respectively from each opening 50A of the third sheet 50 will be conducted the same patterning as the electrode pattern of the upper electrode layer 34 (FIG. 4) of the piezoelectric actuator 22 (FIG. 4) using such as the photolithography.

Furthermore, each available part of the multi-layer plate 51 exposing respectively from each opening 50A of the third sheet 50 will be separated. Thus, the piezoelectric actuator 22 formed of available part Adv of the multi-layer plate 51 having the densified first and second sheets 40 and 41 to be the first and the second piezoelectric layers 30 and 32 (FIG. 4) respectively and the first~the third conductor layers 42~44 as the upper electrode layer 34, the lower electrode layer 31 and the electrode for polarization 33 (FIG. 4) respectively can be obtained.

In this connection, thus obtained piezoelectric actuator 22 will be affixed to other surface 20B of the passage plate 20 afterwards. However, this process can be conducted under the condition reinforced by the third sheet 50 formed of reinforcement layer as shown in FIG. 8A.

More specifically, as described above regarding FIG. 8A, after applying the patterning to each part of the first conductor layer 42 exposing respectively from each opening 50A of the third sheet 50 as shown in FIG. 8B, the passage plate 20 is affixed to the third conductor layer 44 of each available part Adv of the multi-layer plate 51 under such condition as shown in FIG. 8B, from its other surface 20B side.

In practice, such operations can be conducted all at once by mounting multiple passage plates 20 corresponding respectively to each opening 50A of the third sheet 50 in the same alignment with each opening 50A and after supplying the adhesive to the other surface 20B of each passage plate 20, determining the position of said multi-layer plate 51 so that each available part Adv of the multi-layer plate 51 reinformed by the third sheet 50 and the other surface 20B of each passage plate 20 face each other, and pressing this to each passage plate 20.

Furthermore, as shown in FIG. 8C, each available part Adv of the multi-layer plate 51 will be cut off using such as the dicing saw. And under the condition reinformed by the third sheet 50, by affixing each available part Adv of the multi-layer plate 51 of each piezoelectric actuator 22 to the passage plate 20 respectively, the piezoelectric actuator 22 can be made not be handled under the thin and breakable condition, and thus, the yield of the piezoelectric actuator 22 can be increased.

(2-2) Operation and Effects of the Present Embodiment

According to the foregoing construction, the first and the second conductor layers 42 and 44 are formed on one surface of the first and the second sheets 40 and 41 formed of green sheet which is formed by using piezoelectric materials and after these first and second sheets 40 and 41 are densified in a piece, the first sheet 40 is polarized and by conducting the patterning to the first conductor layer 42, the piezoelectric actuator 22 will be manufactured.

Furthermore, since the third sheet 50 formed of ceramic materials on which openings 50A having the same size and shape as the desired piezoelectric actuator 22 will be densified with the first and the second sheet 40 and 41 into one piece during a series of these operations, the densified third sheet 50 can reinforce the multi-layer plate 51 which becomes the source of piezoelectric actuator 22 as the reinforcement layer.

Thus, according to such piezoelectric actuator 22 manufacturing method, the piezoelectric actuator 22 (multi-layer plate 51) can be handled easily and can make the piezoelectric actuator (multi-layer plate 51) not to be broken easily. And the yield at the time when manufacturing the piezoelectric actuator 22 can be increased.

According to the foregoing construction, since after forming the first and the second conductor layers 42 and 43 on one surface of the first and the second sheets 40 and 41 formed of green sheets using piezoelectric materials respectively, these first and the second sheets 40 and 41 are densified with the third sheet 50 formed of ceramic material green sheet in a piece, and as well as polarizing thus obtained first sheet 40 of the multi-layer plate 51, conducting the patterning to the first conductor layer 42, the piezoelectric actuator 22 will be manufactured, the breakage of the piezoelectric actuator 22 (multi-layer plate 51) when manufacturing this can be prevented by reinforcing the multi-layer plate 51 which becomes the source of piezoelectric actuator 22 and the yield can be increased. And thereby the productivity of the piezoelectric actuator 22 can be remarkably improved.

(3) Other Embodiments

The embodiment described above has dealt with the case of applying the piezoelectric actuator and its manufacturing method according to the present invention to the ink-jet printhead 14 and its manufacturing method. However, the present invention is not only limited to this but also it is suitably applied to the piezoelectric actuator and its manufacturing method to be used other than the ink-jet printhead 14.

Moreover, the embodiment described above has dealt with the case of patterning the upper electrode layer 34 of the piezoelectric actuator 22 corresponding to each pressure chamber 20C of the passage plate 20 so that it will be formed of multiple upper electrodes 34A. However, the present invention is not only limited to this but also patterning may be conducted to the lower electrode layer 31 or to both the lower electrode layer 31 add the upper electrode layer 34. For example, in the case of patterning the lower electrode layer 31, the second conductor layer 43 may be formed with such pattern in advance at the time of processing shown in FIG. 5B.

Furthermore, the embodiment described above has dealt with the case of densifying the second piezoelectric layer 32 functioning as the vibration plate and the electrode for polarization 33 with the first piezoelectric layer 30, the upper electrode layer 34 and the lower electrode 31 in a piece. However, the present invention is not only limited to this but also the piezoelectric actuator may be formed after forming the upper electrode layer 34 and the lower electrode layer 31 which are patterned or not patterned, on one surface and the other surface of the first piezoelectric layer 30, by bonding these onto the vibration plate formed of predetermined materials using adhesives.

Furthermore, the embodiment described above has dealt with the case of constructing the passage plate 20 and ink plate 21 as the pressure chamber forming unit on which pressure chambers comprised of multiple concave parts are provided on one surface as shown in FIGS. 2 and 3. However, the present invention is not only limited to this but also various other constructions can be widely applied.

Figure 10:
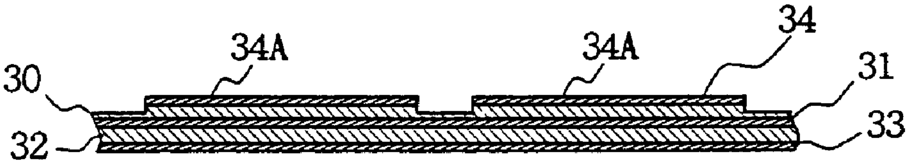
FIG. 10 is a cross sectional view showing the construction of a piezoelectric actuator according to the other embodiment.
Figure 12:
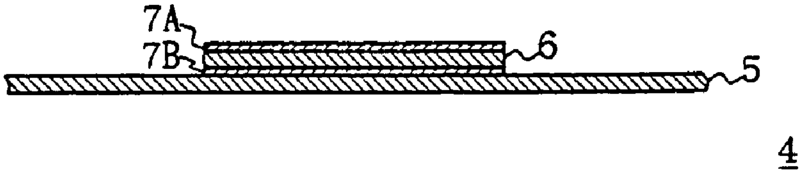
FIG. 12 (Prior Art)
FIG. 12 is a cross sectional view showing the construction of a piezoelectric actuator in the conventional ink-jet printhead.

Moreover, the embodiment described above has dealt with the case of patterning only the first conductor layer 42 of the multi-layer plate 45. However, the present invention is not only limited to this but also, when patterning the first conductor layer 42 of the multi-layer plate 45, as shown in FIG. 10, the patterning may be conducted by using the sandblast method so that only the part directly below each upper electrode 34A of the first sheet 40 (equivalent to the first piezoelectric layer 30) remains together with the first conductor layer 42 or at least allowing the space between each upper electrode 34A.

With this arrangement, parts directly below each upper electrode 34A of the piezoelectric actuator 22, which function as an independent actuator respectively can be made unsusceptible to the effects of adjacent actuators. Moreover, with such arrangement, the amount of processing using the sandblast method can be comparatively roughly controlled.

Moreover, the embodiment described above has dealt with the case of forming the second sheet 41 which becomes the source of the second piezoelectric layer 32 to function as a vibration layer using piezoelectric materials. However, the present invention is not only limited to this but also various other materials can be widely applied.

Furthermore, the embodiment described above has dealt with the case of forming the vibration layer to generate pressure in the pressure chamber 20C displacing in each pressure chamber 20C of the passage plate 20 with the second piezoelectric layer 32 and the electrode layer for polarization 33. However, the present invention is not only limited to this but also various other constructions can be widely applied as the construction of the vibration layer.

Furthermore, the embodiment described above has dealt with the case of forming the piezoelectric actuator 22 with five layers, i.e., the upper electrode layer 34, the first piezoelectric layer 30, the lower electrode layer 31, the second piezoelectric layer 32 and the electrode layer for polarization 33. However, the present invention is not only limited to this but also the piezoelectric actuator with four-layer construction omitting the electrode layer for polarization 33 may be formed.

And in this case, after determining the position and attaching this piezoelectric actuator onto the other surface 20B of the passage plate 20, placing the voltage between each upper electrode 34A and the lower electrode layer 31, only between each upper electrode 34A and the lower electrode layer 31 may be polarized. In this case, although the deflection occurs in the piezoelectric actuator caused by the polarization processing, this may be initialized, and doing this an occurrence of inconvenience due to warp in the piezoelectric actuator when affixing this to the passage plate 20 can be prevented.

Moreover, the piezoelectric actuator 22 may be constructed with four layers, such as the upper electrode layer 34, the first piezoelectric layer 30, the lower electrode layer 31 and the vibration layer formed of the predetermined materials other than piezoelectric materials. However, in this case, since it is necessary to increase the frequency of vibration, it is desirable to apply ceramic materials such as zirconia and alumina, having high Young's modulus as the material of vibration layer.

Furthermore, the piezoelectric actuator may be formed with three layers, i.e., the upper electrode layer 34, the first piezoelectric layer 30 and the lower electrode layer 31. Provided that in this case, the lower electrode layer 31 is formed with more than double the thickness of the upper electrode layer 34, and the part on the surface side facing to the passage plate 20 will be used as the vibration layer. And in this case metal such as nickel having high Young's modulus and excellent ink resistance and conductive ceramics may be used as the material of the lower electrode layer 31.

Moreover, the embodiments described above in FIGS. 5 and 6, and FIGS. 7 and 8 have dealt with the case of manufacturing the piezoelectric actuator 22 using green sheets. However, the present invention is not only limited to this but also the piezoelectric actuator 22 may be manufactured by successively laminating conduction materials and piezoelectric materials using such as the sputtering method, printing method and plating method. In short, if the piezoelectric actuator 22 would be manufactured by using the multi-layer plate manufacturing process capable of directly laminating the upper electrode layer, the first piezoelectric layer, the lower electrode layer and the vibration layer successively without using the adhesive, various other multi-layer plate manufacturing process can be widely applied as the manufacturing process of the piezoelectric actuator 22.

Furthermore, the embodiment described above has dealt with the case of applying ceramic materials as the material of the third sheet 50. However, the present invention is not only limited to this but also various other materials can be applied as the material of the third sheet 50, provided that the densified third sheet 50 has the high strength that can prevent an accidental breakage preventing the warp when handling the multi-layer plate 51.

Moreover, the embodiment described above has dealt with the case of laminating and forming the third sheet 50 together with the multi-layer plate 51 on the first conductor layer 42 formed by one surface side of the multi-layer plate 51. However, the present invention is not only limited to this but also the third sheet 50 may be piled and formed together with said multi-layer plate 51 on the third conductor layer 44 formed by the other surface side of the multi-layer plate 51 (i.e., the first~the third sheet 40, 41 and 50 may be piled and densified in order of the third sheet 50, the third conductor layer 44, the second sheet 41, the second conductor layer 43, the first sheet 40 and the first conductor layer 42 from the bottom layer).

Furthermore, the embodiment described above has dealt with the case of providing openings 50A in the third sheet 50 as shown in FIG. 9. However, the present invention is not only limited to this but also various other shapes can be applied as the shape of opening 50A.

Industrial Applicability

The present invention can be utilized in the ink-jet printer device.

The invention claimed is:

1. A method of manufacturing a piezoelectric actuator, which generates pressure in each pressure chamber of a pressure chamber forming unit on which pressure chambers formed of multiple concave parts are provided on one surface, comprising:

a first process comprising:

forming a first sheet formed of pliant piezoelectric materials and a second sheet formed of pliant materials, forming an upper electrode layer formed of conduction materials on one surface of said first sheet, and forming a lower electrode layer formed of conduction materials on the other surface of said first sheet or one surface of said second sheet, wherein an electrode layer for polarization formed of conduction material is formed on the other surface side of said second sheet;

a second process comprising piling and densifying said first and second sheets having said lower electrode layer between;

a third process comprising polarizing said first sheet in a direction of a thickness of the first sheet; and a fourth process comprising patterning said upper electrode layer in order to form multiple electrodes corresponding respectively to each said pressure chamber of said pressure chamber forming unit, wherein the upper electrode layer and electrode layer for polarization are located external to any other layers of the actuator, such that by placing a voltage across a face surface of said upper electrode layer and a face surface of said electrode layer for polarization, said first sheet is polarized in the direction of a thickness of the first sheet, whereby warping of the actuator during polarization is reduced.

2. A method of manufacturing a piezoelectric actuator as defined in claim 1, characterized by:

in the second process, a pliant third sheet having openings with a predetermined size and shape is piled on one surface side of said first sheet or the other surface side of the second sheet, and said third sheet is densified together with said first and the second sheets.

3. A method of manufacturing a piezoelectric actuator as defined in claim 1, characterized by:

in said fourth process, one surface side of said first sheet is patterned together with said upper electrode layer so that the first sheet will be separated corresponding respectively to each said pressure chamber of said pressure chamber forming unit.

4. A method of manufacturing a piezoelectric actuator as defined in claim 1, characterized by:

in said first process, ceramic materials are used as said material of the second sheet.

5. A method of manufacturing a piezoelectric actuator as defined in claim 1, characterized by:

in said first process, said lower electrode layer is formed thicker than said upper electrode layer; and the other surface side of said lower electrode layer is a vibrator that generates pressure for ejecting ink in said pressure chamber.

6. A method of manufacturing a piezoelectric actuator, the method comprising:

forming a first sheet from piezoelectric material;

forming a second sheet from pliant materials;

forming an upper electrode layer from conduction material on one surface of the first sheet;

forming a lower electrode layer from conduction material on an opposite surface of the first sheet or one surface of the second sheet;

forming an electrode layer for polarization from conduction material on another surface side of the second sheet;

piling and densifying the first and second sheets having the lower electrode layer there between;

polarizing the first sheet in a direction of a thickness of the first sheet by placing a voltage across a face surface of the upper electrode layer and a face surface of the electrode layer for polarization, wherein the upper electrode layer and electrode layer for polarization are located external to any other layers of the actuator, thereby reducing warping of the actuator during polarization; and patterning the upper electrode layer in order to form multiple electrodes.

* * * * *